(12) United States Patent
Amaral et al.

(10) Patent No.: US 11,070,230 B2
(45) Date of Patent: **\*Jul. 20, 2021**

(54) RUN-LENGTH BASE-DELTA ENCODING FOR HIGH-SPEED COMPRESSION

(71) Applicant: INTERNATIONAL BUSINESS MACHINES CORPORATION, Armonk, NY (US)

(72) Inventors: Jose N. Amaral, Edmonton (CA); Christopher M. Barton, Stouffville (CA); Taylor J. Lloyd, Edmonton (CA); Ettore Tiotto, Whitby (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/521,627

(22) Filed: Jul. 25, 2019

(65) Prior Publication Data

US 2019/0349000 A1    Nov. 14, 2019

Related U.S. Application Data

(63) Continuation of application No. 15/828,385, filed on Nov. 30, 2017, now Pat. No. 10,419,022.

(51) Int. Cl.
  *H03M 7/00* (2006.01)
  *H03M 7/48* (2006.01)
  (Continued)

(52) U.S. Cl.
  CPC ............. *H03M 7/48* (2013.01); *H03M 7/46* (2013.01); *H03M 7/6029* (2013.01)

(58) Field of Classification Search
  CPC .. H03M 7/6011; H03M 13/07; H03M 7/4006; H03M 13/1114; H03M 13/2909;
  (Continued)

(56) References Cited

U.S. PATENT DOCUMENTS 5,627,533 A    5/1997   Clark
5,729,228 A    3/1998   Franaszek
(Continued)

FOREIGN PATENT DOCUMENTS

WO    2016186563 A1    11/2016

OTHER PUBLICATIONS

IBM: List of IBM Patents or Patent Applications Treated as Related (Appendix P), Jul. 31, 2019, 2 pages.
(Continued)

*Primary Examiner* — Linh V Nguyen
(74) *Attorney, Agent, or Firm* — Ewa M. Wozniak

(57) ABSTRACT

A method, computer system, and a computer program product for high-speed data compression is provided. The present invention may include receiving an input stream. The present invention may include selecting a header based on the received input stream, wherein the header includes a base, a scheme and a delta count. The present invention may include determining whether there are any remaining values in an uncompressed input stream. The present invention may include reading a first next value from the input stream. The present invention may include determining whether the read first next value is representable with a current base scheme. The present invention may include calculating the delta count based on determining that the read first next value is representable with the current base scheme. The present invention may include writing the calculated delta count to the selected header. The present invention may include incrementing the written delta count.

20 Claims, 8 Drawing Sheets

(51) Int. Cl.
*H03M 7/30* (2006.01)
*H03M 7/46* (2006.01)

(58) Field of Classification Search
CPC .......... H03M 7/30; H03M 13/00; H03M 7/40; H03M 7/3088; H03M 7/6005; H03M 5/145; H03M 7/3084; H03M 7/42; H03M 7/3086; H03M 7/4093; H03M 7/3062; H03M 7/48; H03M 7/60
USPC ...................................... 341/64–69, 106, 107
See application file for complete search history.

(56) References Cited

U.S. PATENT DOCUMENTS

| | | | |
|---|---|---|---|
| 5,884,269 A * | 3/1999 | Cellier | G10L 19/04 341/64 |
| 6,577,254 B2 | 6/2003 | Rasmussen | |
| 6,819,271 B2 | 11/2004 | Geiger | |
| 7,321,995 B2 | 1/2008 | Kikuchi | |
| 7,714,747 B2 | 5/2010 | Fallon | |
| 7,783,781 B1 | 8/2010 | Rothstein | |
| 7,936,290 B2 | 5/2011 | Wezelenburg | |
| 8,054,879 B2 | 11/2011 | Fallon | |
| 8,275,909 B1 | 9/2012 | Rothstein | |
| 8,417,833 B1 | 4/2013 | Amdahl | |
| 8,429,111 B1 * | 4/2013 | Kailash | H03M 7/40 706/46 |
| 8,497,788 B1 * | 7/2013 | Miller | H03M 7/30 341/51 |
| 8,610,606 B2 | 12/2013 | Glass | |
| 9,143,546 B2 | 9/2015 | Fallon | |
| 9,418,133 B2 | 8/2016 | Huang | |
| 9,564,917 B1 | 2/2017 | Satpathy | |
| 10,419,022 B2 * | 9/2019 | Amaral | H03M 7/48 |
| 2003/0058143 A1 * | 3/2003 | Chiba | H04N 19/61 341/67 |
| 2003/0085823 A1 * | 5/2003 | Lee | H03M 7/30 341/76 |
| 2007/0061546 A1 * | 3/2007 | Berger | H03M 7/30 711/202 |
| 2012/0002683 A1 * | 1/2012 | You | H04L 69/22 370/477 |
| 2012/0059804 A1 | 3/2012 | Tapply et al. | |
| 2014/0104084 A1 * | 4/2014 | Cohen | H03M 7/3079 341/87 |
| 2014/0188822 A1 * | 7/2014 | Das | H03M 7/30 707/693 |
| 2014/0223029 A1 * | 8/2014 | Bhaskar | H04L 69/04 709/247 |
| 2015/0261779 A1 | 9/2015 | Huang | |
| 2015/0302279 A1 * | 10/2015 | Holley | H04L 45/74 358/1.15 |
| 2017/0155404 A1 | 6/2017 | Karkkainen | |
| 2019/0165804 A1 | 5/2019 | Amaral | |

OTHER PUBLICATIONS

Che et al.,"Rodinia: A Benchmark Suite for Heterogeneous Computing," IEEE International Symposium on Workload Characterization (IISWC), 2009, p. 44-54.
Google, "Snappy: A Fast Compressor/Decompressor," GitHub, p. 1-3, https://github.com/google/snappy, Accessed on Nov. 13, 2017.
Gordon et al.,"Exploiting Coarse-Grained Task, Data, and Pipeline Parallelism in Stream Programs," ASPLOS'06, Oct. 21-25, 2006, p. 151-162, ACM, San Jose, California, USA.
Lee et al., "Warped-Compression: Enabling Power Efficient GPUs through Register Compression," ISCA '15, Jun. 13-17, 2015, p. 502-514, ACM, Portland, OR, USA.
LZ4, "lz4: Extremely Fast Compression Algorithm," GitHub, p. 1-3, https://github.com/lz4/lz4, Accessed on Nov. 13, 2017.
Mell et al., "The NIST Definition of Cloud Computing," National Institute of Standards and Technology, Sep. 2011, p. 1-3, Special Publication 800-145.
Ozsoy et al., "Pipelined Parallel LZSS for Streaming Data Compression on GPGPUs," IEEE 18th International Conference on Parallel and Distributed Systems, 2012, p. 37-44, IEEE Computer Society.
Pekhimenko et al., "A Case for Toggle-Aware Compression for GPU Systems," IEEE International Symposium on High Performance Computer Architecture (HPCA), 2016, p. 188-200.
Pekhimenko et al., "Base-Delta-Immediate Compression: Practical Data Compression for On-Chip Caches," PACT'12, Sep. 19-23, 2012, p. 1-12, ACM, Minneapolis, Minnesota, USA.
Pekhimenko et al., "Linearly Compressed Pages: A Low-Complexity, Low-Latency Main Memory Compression Framework," MICRO-46, Dec. 7-11, 2013, p. 1-13, ACM Davis, CA, USA.
Vijaykumar et al., "A Case for Core-Assisted Bottleneck Acceleration in GPUs: Enabling Flexible Data Compression with Assist Warps," ISCA'15, Jun. 13-17, 2015, p. 1-13, ACM, Portland, OR, USA.
Welton et al., "Improving I/O Forwarding Throughput with Data Compression," IEEE International Conference on Cluster Computing, 2011, p. 438-445, IEEE Computer Society.
Wijeyasinghe et al., "A Multi-Codec Framework to Enhance Data Channels in FPGA Streaming Systems," Applied Reconfigurable Computing (ARC 2016), 2016, p. 207-219, LNCS 9625, Springer International Publishing Switzerland.

* cited by examiner

RUN-LENGTH BASE-DELTA ENCODING FOR HIGH-SPEED COMPRESSION

BACKGROUND

The present invention relates generally to the field of computing, and more particularly to data compression.

Data compression reduces the resources needed to store and transmit data. Data decompression uses resources to reverse the compression process. Hardware based and software based data compression and decompression may have different benefits. Hardware data compression and decompression may be a faster process, however, also may have a higher cost due to specialized hardware used to compress and decompress the data. Software data compression and decompression may offer more configuration options, lower cost and longer term storage capability. Optimal data compression and decompression may come with a trade-off between factors such as level of compression, amount of distortion and required resources to compress and decompress the data.

SUMMARY

Embodiments of the present invention disclose a method, computer system, and a computer program product for high-speed data compression. The present invention may include receiving an input stream. The present invention may also include selecting a header based on the received input stream, wherein the header includes a base, a scheme and a delta count. The present invention may then include determining whether there are any remaining values in an uncompressed input stream based on the selected header. The present invention may further include reading a first next value from the input stream. The present invention may also include determining whether the read first next value is representable with a current base scheme. The present invention may then include calculating the delta count based on determining that the read first next value is representable with the current base scheme. The present invention may further include writing the calculated delta count to the selected header. The present invention may also include incrementing the written delta count.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
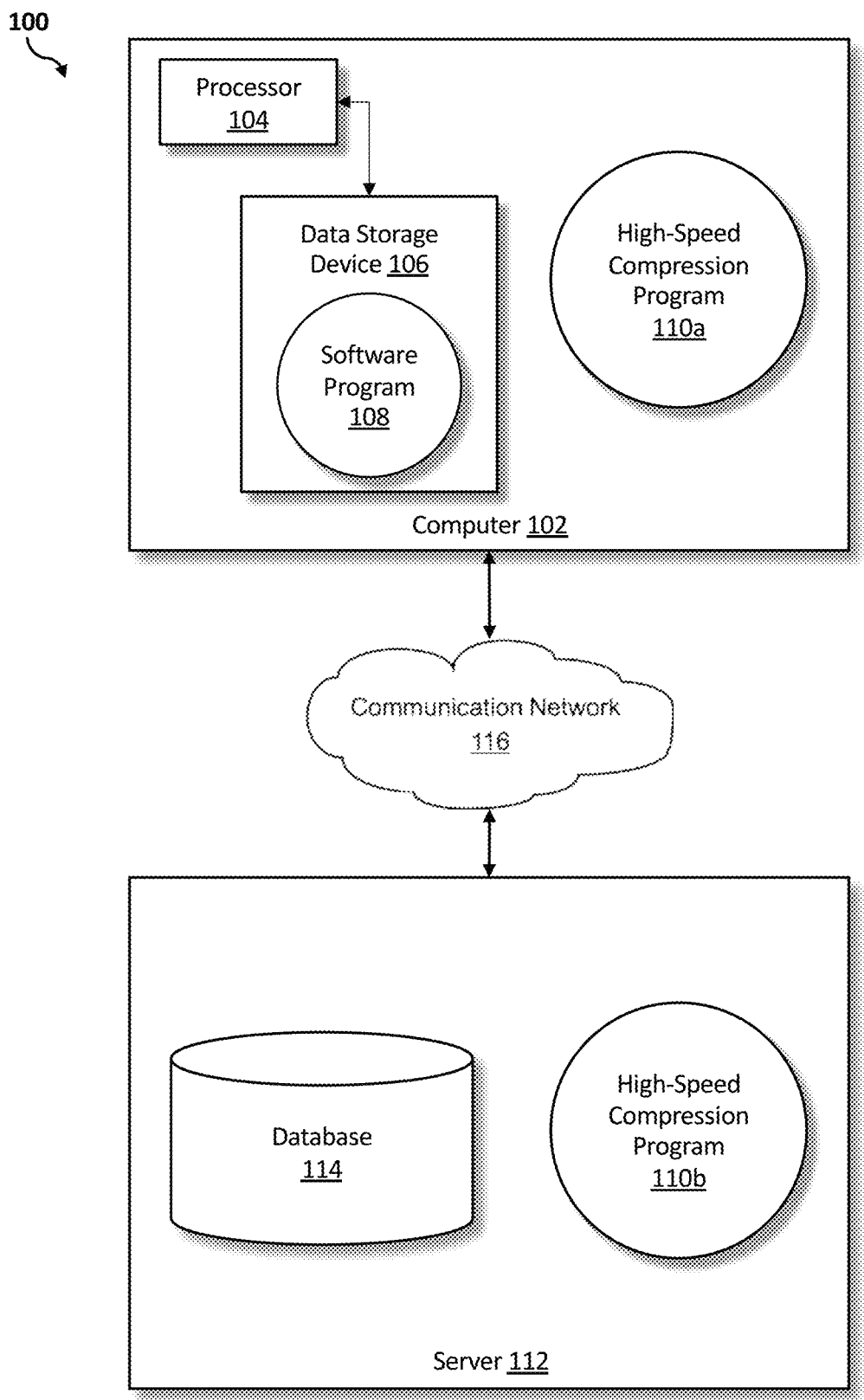
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method and program product for high-speed data compression. As such, the present embodiment has the capacity to improve the technical field of data compression by using a run-length base-delta (RLBD) encoding scheme. More specifically, RLBD may encode data using a software-driven encoding scheme that compresses data to be transferred between a computer and an accelerator device without the need to operate with fixed-length data segments.

As previously described, data compression reduces the resources needed to store and transmit data. Data decompression uses resources to reverse the compression process. Hardware based and software based data compression and decompression may have different benefits. Hardware data compression and decompression may be a faster process, however, also may have a higher cost due to specialized hardware used to compress and decompress the data. Software data compression and decompression may offer more configuration options, lower cost and longer term storage capability. Optimal data compression and decompression may come with a trade-off between factors such as level of compression, amount of distortion and required resources to compress and decompress the data.

A Base-Delta-Immediate (BΔI) compression scheme may typically be implemented on a computing system when memory locations are close in proximity and when the address space has similar values. The BΔI compression scheme may be used for on-chip caches when a fixed length data segment, such as the length of the cache line, is encoded. Encoding may be accomplished by scanning values and determining the minimum size delta field that is necessary to encode the values that appear in the fixed length data segment. BΔI is typically designed for hardware based compression and allows for efficient hardware instructions. Hardware instructions may include, for example, bit-packing instructions, which may not be cost-effective to simulate using software capabilities.

Therefore, it may be advantageous to, among other things, provide a compression scheme that is suitable for the transfer of data between the main memory of a computer and the memory of an accelerator device using a software-based compression scheme. A compression scheme may also be known as an encoding scheme. A decompression scheme may also be known as a decoding scheme.

According to at least one embodiment, one encoding scheme is a run-length base-delta (RLBD) encoding scheme. The RLBD encoding scheme may be software-based and provide reasonable compression ratios while performing at speeds near that of an efficient memory copy for both compression and decompression. RLBD encoding may be derived from BΔI compression. One benefit of using RLBD encoding for software-driven data compression for transferring data between a central processing unit (CPU) and an accelerator device is that RLBD may not require operating with a fixed-length data segment when BΔI compression does require using a fix-length data segment. RLBD may fix the size of the delta and identify the longest data segment that may be encoded using a fix-length delta. A sequential RLBD decoding algorithm may then be implemented. An efficient, device-side decompression algorithm for RLBD encoding may use cooperative parallelism to decode frames and a data segment directory (DSD) to enable many sections of the data to be decoded in parallel.

A DSD may contain information about the starting address for each uncompressed data segment. Since RLBD encoding may operate with variable length data segments, the DSD directory may inform the decoder about the layout of the decompressed data. The DSD directory may also be transmitted along with the compressed data.

Additionally, a compression-transmission-decompression pipeline (CTDP) system may break a large data set transmitted between the main memory of a computer and the memory of an accelerator device into smaller data chunks. The pipeline may then compress and transmit the data for better efficiency. RLBD encoding may be used for compression in the CTDP system. RLBD encoding may provide a less expensive means to enable a software implementation by requiring a single aligned memory read, write and conditional per 8-byte word. RLBD may be implemented to provide comparable compression and decompression speeds similar to the speed of the copy of data in memory.

The present embodiment may select the most capable functional compressor with a compression scheme that may run properly on the compressor. Additionally, no particular data block size may need to be defined since the compression scheme may continue compressing data until either compression under the currently running scheme is no longer possible or a timeout causes a new scheme to be identified and used. Selecting a new compressor may be done after a variable timeout period or when the current compressor cannot produce a valid compression for the next datum. Additionally, this embodiment allows data of varying sizes rather than requiring a fixed-size data block.

The RLBD compression scheme may calculate the common portion (i.e., delta calculation) for all of the compressors and use the size of the delta to select the compressor. When calculating deltas, historical context (i.e., historical data or a historical copy of data) may not be required. Instead, earlier values within the data to be compressed may be used.

Split run-length encoding may be used to compare sequential values to a shared base and encode each value as it is encountered, as opposed to performing encoding after the entire run-length segment has been completed. Delta coding may be used in a shared base for multiple values and may generate sequences of values of the same size to reduce storage constraints.

Referring to FIG. 1, an exemplary networked computer environment 100 in accordance with one embodiment is depicted. The networked computer environment 100 may include a computer 102 with a processor 104 and a data storage device 106 that is enabled to run a software program 108 and a high-speed compression program 110a. The networked computer environment 100 may also include a server 112 that is enabled to run a high-speed compression program 110b that may interact with a database 114 and a communication network 116. The networked computer environment 100 may include a plurality of computers 102 and servers 112, only one of which is shown. The communication network 116 may include various types of communication networks, such as a wide area network (WAN), local area network (LAN), a telecommunication network, a wireless network, a public switched network and/or a satellite network. It should be appreciated that FIG. 1 provides only an illustration of one implementation and does not imply any limitations with regard to the environments in which different embodiments may be implemented. Many modifications to the depicted environments may be made based on design and implementation requirements.

The client computer 102 may communicate with the server computer 112 via the communications network 116. The communications network 116 may include connections, such as wire, wireless communication links, or fiber optic cables. As will be discussed with reference to FIG. 7, server computer 112 may include internal components 902a and external components 904a, respectively, and client computer 102 may include internal components 902b and external components 904b, respectively. Server computer 112 may also operate in a cloud computing service model, such as Software as a Service (SaaS), Platform as a Service (PaaS), or Infrastructure as a Service (IaaS). Server 112 may also be located in a cloud computing deployment model, such as a private cloud, community cloud, public cloud, or hybrid cloud. Client computer 102 may be, for example, a mobile device, a telephone, a personal digital assistant, a netbook, a laptop computer, a tablet computer, a desktop computer, or any type of computing devices capable of running a program, accessing a network, and accessing a database 114. According to various implementations of the present embodiment, the high-speed compression program 110a, 110b may interact with a database 114 that may be embedded in various storage devices, such as, but not limited to a computer/mobile device 102, a networked server 112, or a cloud storage service.

According to the present embodiment, a user using a client computer 102, a server computer 112 or an accelerator device, such as a graphics processing unit (GPU), may use the high-speed compression program 110a, 110b (respectively) to compress data being transferred between the main memory of the computer 102 and the memory of an accelerator device. The high-speed compression method is explained in more detail below with respect to FIGS. 2-6.

Figure 2:
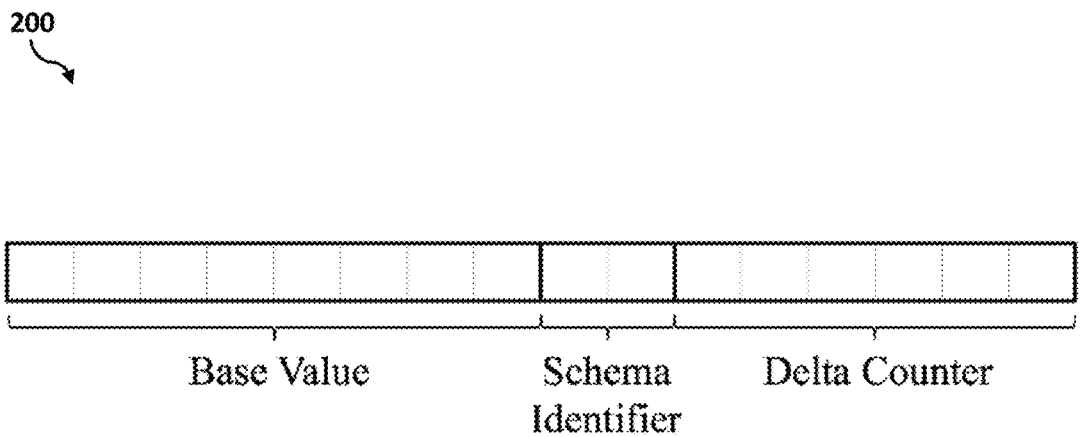
FIG. 2 is a block diagram of the RLBD encoding header configuration according to at least one embodiment.

Referring to FIG. 2, a block diagram of the RLBD encoding header configuration 200 in accordance with one embodiment is depicted. RLBD encoding may include an RLBD encoded stream formatted as at least one h-byte header, followed by n deltas of size b, where n and b are specified in the header. The header may be formatted as a v-byte base value followed by an s-byte scheme identifier and a c-byte counter, where h=v+s+c, where h is the header, v is the base value or size specified by the schema, s is the schema identifier and c is the delta counter. For example, an RLBD encoding header configuration 200 may be implemented with h=16, v=8, s=2, and c=6 and have a header configuration as shown in FIG. 2. Since the header has a fixed size, the base value field must be able to hold a base of the largest size allowed by the schema. Each box in FIG. 2 represents one byte.

A valid option for a schema identifier in the RLBD encoding header configuration 200 example may be a hexadecimal number preceded by 0x. Appended to the header may be an array of n d-byte deltas, where d may be determined by the schema in the header and n may be the value written to the delta counter. The header and array of deltas may describe a sequence of n+1 v-byte values, where v is the base size specified by the schema. The header and the array of deltas together may be referred to as a frame. The sequence may be determined by the following function:

$$\text{value}[i] \leftarrow \begin{cases} \text{base}, & \text{if } i + 0 \\ \text{base} + \text{delta}[i-1], & \text{otherwise} \end{cases}$$

and table identifiers for various possible schemas are shown below.

| Schema | Identifier |
| --- | --- |
| 8-byte Base, 0-byte Deltas | 0x0800 |
| 8-byte Base, 1-byte Deltas | 0x0801 |
| 8-byte Base, 2-byte Deltas | 0x0802 |
| 8-byte Base, 4-byte Deltas | 0x0804 |
| 8-byte Base, 8-byte Deltas | 0x0808 |
| 4-byte Base, 1-byte Deltas | 0x0401 |
| 4-byte Base, 2-byte Deltas | 0x0402 |

An example to illustrate RLBD encoding may include considering the transmission of the following sequence of data using an 8-byte base with a 1-byte delta:

```
0x0000000080008000   0x0000000080008008   0x0000000080008010   0x0000000080008018
0x0000000080008020   0x0000000080008028   0x0000000080008030   0x0000000080008038
0x0000000080008040   0x0000000080008048   0x0000000080008050   0x0000000080008058.
```

Using the RLBD encoding header configuration 200 and the sequence of data in the previous example, the data may be compressed to

```
0x0000000080008000   0x080100000000000B   0x0810182028303840   0x485058.
```

Comparing RLBD encoding with BΔT compression, the BΔT compression with a 32-byte cache-line size would scan the first 32 bytes and discover that one byte is needed to encode the delta and then the BΔT compression would repeat the process for the next 32-byte data segment. The BΔT compression fix-length data segments require repeated transmission of the first value in the cache line, but does not require the transmission of the number of deltas in the sequence. Therefore, the BΔT compression would result in the following compressed data:

```
0x0000000080008000        0x081018
0x0000000080008020        0x081018
0x0000000080008040        0x018018.
```

For a long sequence of similar values, the RLBD encoding may only need to transmit the base value in an uncompressed form one time, however, it will also need to transmit the number of deltas in each compressed segment.

An RLBD encoded sequence may not have a terminator symbol, therefore, the length of the compressed data may be required to perform decoding. An algorithm may implement RLBD decoding. The algorithm may allow for little overhead introduced by the decompression of data, which may only require an addition per delta. A pseudocode is shown below as part of the decoding algorithm for the RLBD encoding values of h=16, v=8, s=2 and c=6.

```
1    let inStream point to an \ rlbd { }- encoded byte array
2    let end point to the end of inStream
3    let outStream point to an appropriately sized output buffer
4    let headerSize be the static size of the header
5    let getBaseSize ( scheme ) return the size in bytes of the base
6          value for a given scheme
7    let getDeltaSize ( scheme ) return the size in bytes of the delta
8          values for a given scheme
9
10   while ( inStream != end ) {
11       // Read in information from the header
12       base = inStream [0..7]
13       schema = inStream [8..9]
14       deltaCount = inStream [10..15]
15       baseSize = getBaseSize ( schema )
16       deltaSize = getDeltaSize ( schema )
17
18       outStream [0.. baseSize ] = base
19       inStream += headerSize
20       outStream += baseSize
21
22       while ( deltaCount > 0 ) {
23           delta = inStream [0.. deltaSize ]
24           outStream [0.. baseSize ] = base + delta
25
26           inStream += baseSize
27           outStream += baseSize
28           deltaCount --;
29       }
30       if( inStream % 8 != 0)
31           inStream += 8 - ( inStream % 8); // align to 8- byte
                boundary
32   }
```

An alternate embodiment of RLBD encoding may include the below sequential algorithm.

```
1    let inStream point to data to be compressed using \ rlbd { }
2    let end point to the end of inStream
3    let outStream point to an appropriately sized output buffer
4    let fitsInBytes (B,N) indicate if a signed integer value N
5          is representable within B bytes
6    let headerSize be the static size of the header
7    let getBaseSize ( scheme ) return the size in bytes of the base
8          value for a given scheme
9    let getDeltaSize ( scheme ) return the size in bytes of the delta
10         values for a given scheme
11
12   while ( inStream != end ) {
13       base8 = inStream [0..7]
14       next8 = inStream [8..15]
15       base4 = inStream [0..3]
16       next4 = inStream [4..7]
17
18       // In order of smallest deltaSize / baseSize
19       if( fitsInBytes (0, base8 - next8 ))
20           schema = 0 x0080
21       else if( fitsInBytes (1, base8 - next8 ))
22           schema = 0 x0081
23       else if( fitsInBytes (2, base8 - next8 ))
24           schema = 0 x0082
25       else if( fitsInBytes (1, base4 - next4 ))
26           schema = 0 x0041
27       else if( fitsInBytes (4, base8 - next8 ))
28           schema = 0 x0084
29       else if( fitsInBytes (2, base4 - next4 ))
30           schema = 0 x0042
31       else
32           schema = 0 x0088
33
34       baseSize = getBaseSize ( schema )
35       deltaSize = getDeltaSize ( schema )
36       headerLoc = outStream
37       base = inStream [0.. baseSize -1]
38
39       inStream += baseSize
40       outStream += headerSize
41
42       // Write deltas as long as they continue to fit
43       while ( fitsInBytes ( deltaSize , base - inStream [0..
             baseSize -1])) {
44           outStream [0.. deltaSize -1] = base - inStream
                [0.. baseSize -1]
45           inStream += baseSize
46           outStream += deltaSize
47       }
48       if( outStream % 8 != 0)
49           outStream += 8 - ( outStream % 8); // align to 8-
                byte boundary
50   }
```

The chain of conditionals below Line 18 shows how each schema can be selected by inspecting only the current and immediately following value in at least one implementation. A single-element lookahead is one of the design options. Looking ahead at further elements may produce more optimal encoding, however, would also lead to slower encoding since the elements may need to be re-read. Schemas may be tested in order of decreasing compression rations, such as getDeltaSize (scheme)/getBaseSize (scheme). Line 43 shows a loop writing out deltas for as long as they continue to fit. Alternative implementations may include additional exit conditions to allow the algorithm to identify new compression opportunities in the data.

An alternate embodiment may include GPU parallel encoding and decoding. A GPU is a widely used accelerator device that may provide high levels of parallelism with the processing performed through a hierarchy that divides the computation in different levels of granularity. An example GPU may use compute unified device architecture, CUDA® (CUDA and all CUDA-based trademarks and logos are trademarks or registered trademarks of NVIDIA Corporation and/or its affiliates), a parallel computing platform and an application programming interface (API). CUDA GPUs may use the levels in a hierarchy that are named threads, warps and blocks. Since parallelism may have both benefits and drawbacks, utilizing all three hierarchy levels may provide an effective use.

One hierarchy may include warp-synchronous parallelism. In warp-synchronous parallelism, threads within the same warp on a CUDA GPU may execute in lockstep. Every thread may either execute the same instruction simultaneously or may perform a no-operation (no-op) while waiting for other threads. A no-op may be needed when a divergency in control flow in the algorithm dictates that a sub-set of the warps should execute a given operation. Lockstep execution may allow threads within a warp to communicate without reading or writing from memory. The communication may be used for rapid information sharing operations and reduction operations. No-ops may also cause slowdowns due to divergent control flow since threads skipping a code section may need to wait for the threads that are executing the particular section.

One other hierarchy may include block-level cooperative parallelism. In block-level cooperative parallelism, threads within the same block, but in different warps, may have access to common shared memory, therefore, the threads may synchronize at defined points. The synchronization may allow threads within a block to cooperate, however, the memory accesses required for synchronization may impact performance. Blocks may be composed of multiple warps and may be subject to the same thread-divergent control flow issues as warps. Warps in a particular block execute on the same streaming multiprocessor (SM), which may limit the overall usage of the GPU.

One other hierarchy may include inter-block independent parallelism. In inter-block independent parallelism, blocks in the CUDA architecture may communicate only through global memory accesses, which may be costly. Blocks may operate independently due to the high synchronization cost. An independent task may be assigned to separate blocks and executed without synchronization. Different blocks may diverge in terms of control flow with no penalty and may be scheduled on different SMs or the GPU for better efficiency.

A CPU encoding algorithm may determine the optimal RLBD scheme. A GPU encoding algorithm may be able to analyze multiple deltas in parallel and avoid excessively short runs. A GPU encoding algorithm may include, for example, a particular CUDA thread index, and every thread may execute the entire program. The below algorithm uses a nested parallelism model combining block-level cooperative and inter-block independent GPU parallelism described above and the algorithm assumes h=16, v=8, s=2 and c=6.

```
1   let inStream point to data to be compressed using \ rlbd { }
2   let end point to the end of inStream
3   let findFirstZero ( bit_array ) return the 0- index of the first unset bit
4       in the array
5   let getBaseSize ( scheme ) return the size in bytes of the base value
6       for a given scheme
7   let getDeltaSize ( scheme ) return the size in bytes of the delta values
8       for a given scheme
9   let selectScheme ( run ) returns a scheme identifier based on some
10      selection criteria over the runs visible in the run dictionary
11
12  baseIdx = 0
13  while ( inStream != end ) {
14      base = inStream [0]
15      value = in Stream [ threadIdx ]
16      base32 = base & 0 xFFFFFFFFul
17      value32 = inStream [ threadIdx /2] >> (32 * ( threadIdx % 2))
18      fits_80 [ threadIdx / warpSize ] = ___ballot ( fitsInBytes (0, base - value ))
19      fits_81 [ threadIdx / warpSize ] = ___ballot ( fitsInBytes (1, base - value ))
20      fits_82 [ threadIdx / warpSize ] = ___ballot ( fitsInBytes (2, base - value ))
21      fits_84 [ threadIdx / warpSize ] = ___ballot ( fitsInBytes (4, base - value ))
22      fits_41 [ threadIdx / warpSize ] = ___ballot ( fitsInBytes (1, base32 -
              value32 ))
23      fits_42 [ threadIdx / warpSize ] = ___ballot ( fitsInBytes (2, base32 -
              value32 ))
24      ___syncthreads ( );
25
26      run [ 0 x0800 ] = findFirstZero ( fits_80 ) - 1
27      run [ 0 x0801 ] = findFirstZero ( fits_81 ) - 1
28      run [ 0 x0802 ] = findFirstZero ( fits_82 ) - 1
29      run [ 0 x0804 ] = findFirstZero ( fits_84 ) - 1
30      run [ 0 x0401 ] = findFirstZero ( fits_41 ) - 1
31      run [ 0 x0402 ] = findFirstZero ( fits_42 ) - 1
32      scheme = selectScheme ( run )
33      deltaSize = getDeltaSize ( scheme )
34      if( getBaseSize ( scheme ) == 4) {
35          base = base32
36          value = value32
37      }
38      if( threadIdx == 0) {
39          outStream [0..7] = base
40          outStream [8..9] = scheme
41          outStream [10..15] = run [ scheme ]-1
42      } else if ( threadIdx < run [ scheme ]) {
43          outStream [8+ threadIdx * deltaSize .. 7+( threadIdx +1)*
                deltaSize ] =
44          base - value
45      }
46      inStream += run_ ( scheme )
47      outStream += 16+( run_ ( scheme )* deltaSize )
48      if( outStream % 8)
49          outStream += 8 - outStream %8
50  }
```

The parallel encoding algorithm may use warp-synchronous and block-level parallelism. Lines 18-23 of the parallel encoding algorithm show the use of warp-synchronous reduction and ballot (pred) may take a predicate as argument and return an integer showing the evaluation of each predicate in the warp as a bitfield. Having all of the threads in the block perform the ballot (pred) operation, the algorithm may construct a block-sized bitfield that all threads may use to determine the optimal scheme to use. The block must synchronize at line 24 of the GPU encoding algorithm to ensure all of the bitfields are written and then every thread independently determines what scheme to select at lines 26-37. The independent computation reduces overhead from excess synchronization, and the threads may be guaranteed to select the same scheme. Lines 38-45 of the GPU encoding scheme write out the header and the deltas.

The presented section of the parallel encoding algorithm may not show writing counts larger than the size of a block and performing bounds checking while determining the length of a run. The full parallel encoding algorithm run may specify thresholds to determine when to stop a run. Additionally, a final step may combine the separately compressed segments into a single contiguous data section and write the data-segment directory (DSD) for parallel decoding.

The parallel decoding algorithm, shown below, may require less computation and fewer opportunities to exploit cooperative parallelism.

```
1    let inStream point to data to be compressed using \ rlbd { }
2    let end point to the end of instream
3    let numThreads refer to the number of threads executing this
     algorithm
4    while ( inStream != end ) {
5        baseIdx = 0
6        base = inStream [0..7]
7        scheme = inStream [8..9]
8        count = inStream [10..15]
9        baseSize = getBaseSize ( scheme )
10       deltaSize = getDeltaSize ( scheme )
11       if( threadIdx == 0)
12           val = base
13       else if( threadIdx <= count )
14           val = base + inStream [16+( threadIdx −1)* deltaSize ..
15                   15+( threadIdx )* deltaSize ]
16       if( threadIdx <= count )
17           outStream [ threadIdx * baseSize ] = val
18       outOffset = 0
19       while ( threadIdx < count )
20           count −= num Threads ;
21           outOffset += numThreads ;
22           if( threadIdx <= count )
23               outStream [ outOffset + threadIdx * baseSize ]
                     = base +
24                   inStream [16+( outOffset + threadIdx −1)*
                     deltaSize ..
25                       15+( outOffset + threadIdx )* deltaSize ]
26
27       inStream += 16+( count * deltaSize )
28       outStream += ( count +1)* baseSize
29   }
```

Threads within each block may independently read the header to determine the base, scheme and count. The threads may then calculate their bounds and cooperatively write out the deltas. Cooperative parallelism may be limited to the length of the sequence being decoded, which may potentially limit the speed of the decoder in the GPU. The parallelism in the parallel decoding algorithm may be found at the block level using a DSD.

The cooperative nature of the encoding and decoding algorithms for the GPU limits the amount of parallelism that can be exposed. To fully utilize the GPU for efficient decoding, many copies of the presented GPU decoding algorithm must be run in parallel. Typically, however, beginning to decode at an arbitrary location in the file may not be possible for two reasons. One reason beginning to decode at an arbitrary location in the file may not be possible may include that the location to start writing the decoded data to output may not be known until the uncompressed size of the preceding data segment is determined. One other reason beginning to decode at an arbitrary location in the file may not be possible may include not knowing whether the starting location is the start of an RLBD segment, or partway through a sequence of deltas.

Implementing a DSD may solve this problem and allow decoding at multiple locations. The DSD may be a list of initialization vectors (IVs). Each IV may be formed by an uncompressed offset, a compressed offset, a stop offset, and a warm-up span. Each offset may be a distance measured in bytes. The start of the uncompressed data segment may be referred to as the uncompressed base address. The start of the compressed data segment may be referred to as the compressed base address. The uncompressed offset and the stop offset may be distances relative to the uncompressed base address and the compressed offset may be a distance relative to the compressed base address.

The warm-up span may specify the number of bytes that must be processed but not written by a decompressor that starts execution at the compressed offset. The role of the warm-up span may be to allow decompression to begin anywhere in a compressed segment. An IV in the DSD may have information about the length of a data segment, in compressed or uncompressed forms, encoded by a single header and may have one or more deltas. A memory address computed by adding the compressed base address and the value of a compressed offset may be a valid starting point for a decompressor. The uncompressed offset may provide the corresponding point in the uncompressed data where a decompressor may begin to emit data when it starts decompression at the compressed offset and has processed, but not written, the number of bytes specified in the warm-up span.

The warm-up span may serve multiple purposes. For example, the warm-up span may include compression schemes that may make use of repeated patterns for compression and typically refer to a buffer of recent history. The warm-up span may allow the decompressor to build a history as if the decompressor had been run serially up to that point. The exact amount of warm-up may vary by the compression scheme and may vary by the data being compressed. One other purpose for the warm-up span may include allowing the DSD to point to an uncompressed offset by pointing to the immediate last valid compression initialization point and performing warm-up decompression up to that point.

An example of RLBD using the warm-up span, allowing the DSD to point to an uncompressed offset, may include a compressible file using a scheme with 0-byte deltas. In this scenario, additional headers may impact performance negatively, therefore, the use of the warm-up span allows multiple independent blocks to process the same header, writing out to the independent blocks' respective sections in parallel.

A DSD may be generated during compression by first selecting a segment size. Every time the compressor may reach a multiple of the segment size, the compressor may generate an IV composed of the uncompressed offset, compressed offset and warm-up span at that point. The generated directory may then append to the compressed stream transmitted along with the compressed data. To enable block-level parallelism during decoding, blocks may read an IV from the DSD and then execute independently in parallel from the points specified in the generated IV.

The following examples use an uncompressed data composed of 8192 bytes of 0x00, followed by 8192 bytes of 0xFF. Using an RLBD with 8-byte words, the first base would be 0x0000 0000 0000 0000. There are 512 such 8-byte words which may be encoded using a 0-byte delta. Using 0xFF bytes may produce the following two frames:

[header (base: 0x0000 0000 0000 0000) (scheme: 0x0800) (count: 511)]; and

[header (base: 0xFFFF FFFF FFFF FFFF) (scheme: 0x0800) (count: 511)].

The frames above may provide two valid starting points for an RLBD decompressor, at the start of each header. The provided starting points may correspond to entries 1 and 3 in the example DSD table with four independent decompression IVs below.

| IV | Uncompressed Offset | Compressed Offset | Warm-Up Span |
|---|---|---|---|
| 1 | 0 | 0 | 0 |
| 2 | 4096 | 0 | 4096 |
| 3 | 8192 | 16 | 8192 |
| 4 | 12288 | 16 | 4096 |

Using a warm-up span may allow additional independent compressors to be used. IVs 2 and 4 may be generated with a warm-up through half of each frame, allowing additional independent decompressors to run without requiring modification to the compression scheme.

A compressor may keep track of the uncompressed and compressed offset of the start of the current frame in order to generate a DSD. Then, an additional IV may be generated by recording the compressed offset and calculating the uncompressed offset and warm-up span from the uncompressed distance into the current frame. Determining when to generate an additional IV may be done through multiple different schemes. Since IVs may be used to enable parallel decompression, one strategy may be to enable N-way parallelism, when points at which to record an IV may be multiples of fileSize/N, including 0.

Figure 3:
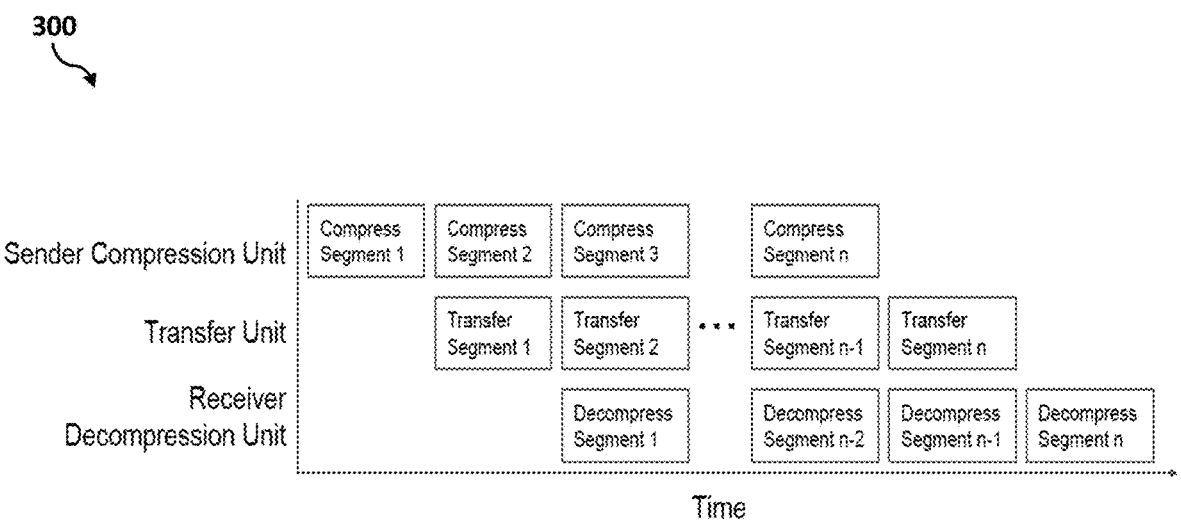
FIG. 3 is a block diagram of the compress-transfer-decompress pipeline (CTDP) according to at least one embodiment.

Referring to FIG. 3, a block diagram of the compress-transfer-decompress pipeline (CTDP) 300 in accordance with one embodiment is depicted. Efficient compression and decompression may provide more efficient data transfers at the expense of computation at either the compression end or the decompression end. More compression schemes are available to use as the computation time goes down (i.e., is faster), however, when the computation time on each side (i.e., compression and decompression ends) is only, for example, four to five times faster than the throughput of the communication link, then a more simple compression and decompression scheme may be required.

RLBD encoding may be suitable for use over high-speed interconnection networks, such as PCI-e, NVLink, or a 10 Gb Ethernet and Infiniband, since compression speed may be too slow for more complex compression algorithms. RLBD encoding may also be used in combination with asynchronous direct memory accesses (DMAs) by a GPU to produce a compression→transfer→decompression pipeline that may improve data throughput as shown in FIG. 3.

Pipelining using CTDP may allow the majority of the compression and decompression latency to be hidden, except for the first compression and the last decompression. The first compression and the last decompression may be visible, therefore, splitting the data transfer into as many small segments as possible may be optimal.

There may be overhead to each segment transfer. Currently the overhead may take approximately constant time to transfer up to 32 KB, and the transfer time rises linearly thereafter. The compressed size of each transfer may therefore be at least 32 KB. The compression and decompression also take time, with compression typically being approximately two to four times faster than the transfer time. The pipeline may become dominated by the compression stage if the compression ratios drop lower than 0.25-0.5. Allowing for compression ratios of up to 0.25, each pipeline stage should accept 32 KB×4=128 KB of uncompressed data. Maximizing the number of 128 KB pipelined segments may limit the overhead when compressing uncompressible data. Uncompressible data may include random data or other high-entropy information. Particular patterns may also be uncompressible by particular compression algorithms. For example, if compression and decompression are both two times faster than transfer, then an overhead that is equivalent to transferring 128 KB of extra data occurs when using compression. By limiting the usage of the CTDP to transfers of a certain threshold size, worst-case overhead is reduced. A minimum threshold size of 2 MB (i.e., 20 segments of 128 KB) is proposed as a threshold at which to enable transfer compression.

Figure 4:
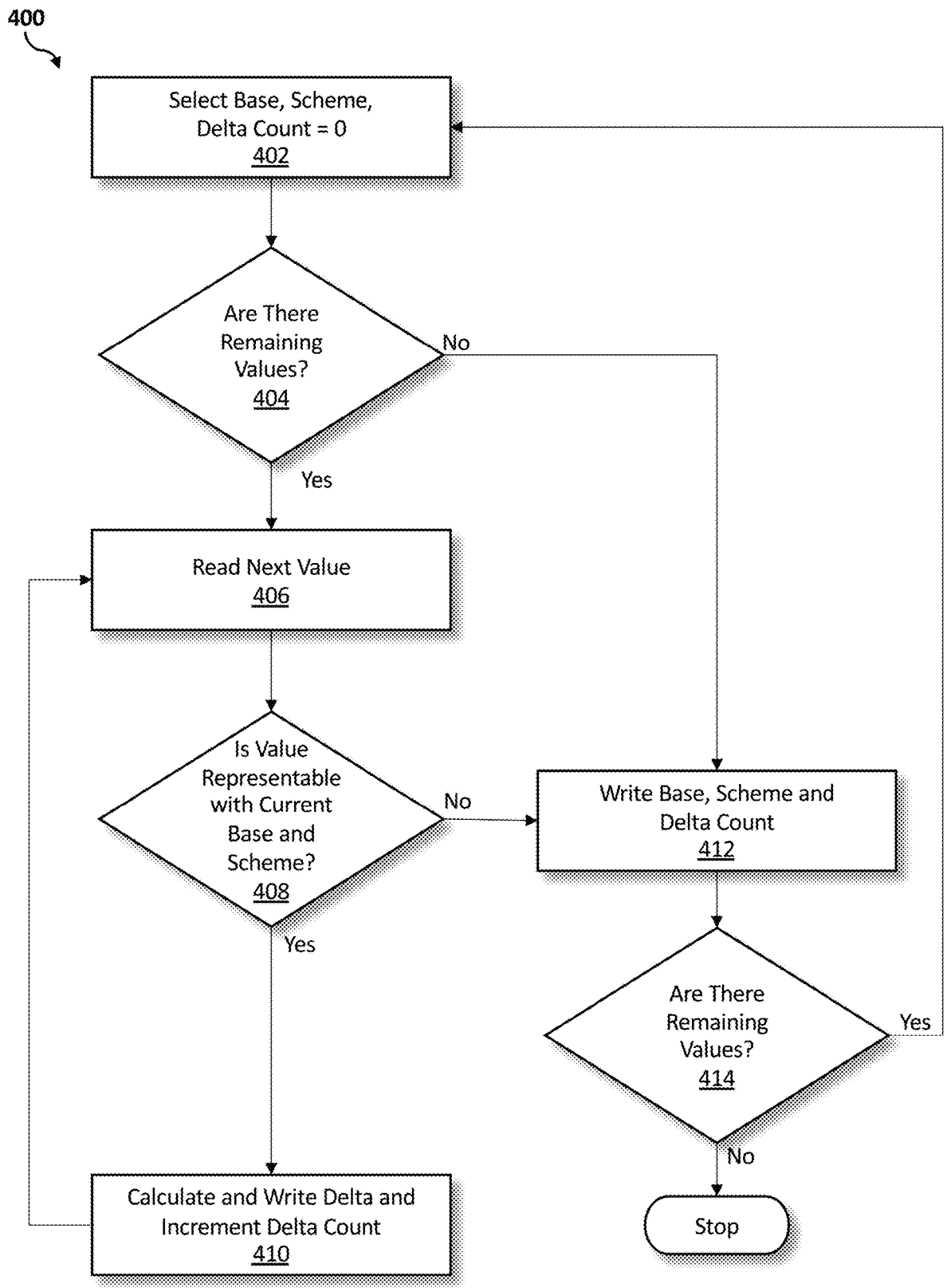
FIG. 4 is an operational flowchart illustrating a process for RLBD compression according to at least one embodiment.

Referring now to FIG. 4, an operational flowchart illustrating the exemplary RLBD compression process 400 used by the high-speed compression program 110a, 110b according to at least one embodiment is depicted.

At 402, a base, scheme and delta count are selected. The current value is read and consumed from the input stream and used as the base. To determine the scheme, the next value in the stream is read, but not consumed. In at least one implementation, the scheme with the greatest compression ratio that can represent the value (i.e., next-base) is selected as the scheme. The delta count is set to zero and will be incremented as values are consumed and compressed into deltas. Space is reserved in the compressed output stream to later be filled with the base, scheme and delta count (i.e., collectively the header).

Then, at 404, the high-speed compression program 110a, 110b determines if there are remaining values in the uncompressed input stream.

If the high-speed compression program 110a, 110b determined that there are remaining values at 404, then the high-speed compression program 110a, 110 reads the next value at 406. The next value is read and consumed by the input stream.

Next, at 408, the high-speed compression program 110a, 110b determines if the value is representable with the current base and scheme. This is determined by calculating the value (i.e., next-base) and verifying that the resulting difference can be represented by the number of bytes specified by the scheme.

If the high-speed compression program 110a, 110b determined that the value is representable with the current base and scheme at 408, then the delta is calculated and written and the delta count is incremented at 410. The delta is appended to the output stream and represented using the number of bytes specified. Then, the next value is read at 406.

If the high-speed compression program 110a, 110b determined that there are no remaining values at 404 or if the value is not representable with the current base and scheme at 408, then a base, scheme and delta count is written at 412.

The base and scheme calculated at 402 and the delta count last updated at 402 or 410 are written into the space reserved at 402.

Next, at 414, the high-speed compression program 110a, 110b determines if there are remaining values. The determination is made by inspecting the uncompressed input stream for additional values.

If the high-speed compression program 110a, 110b determined that there are remaining values at 414, then a base, scheme and delta count is selected at 402.

If the high-speed compression program 110a, 110b determined that there are no remaining values at 414, then the program stops.

Figure 5:
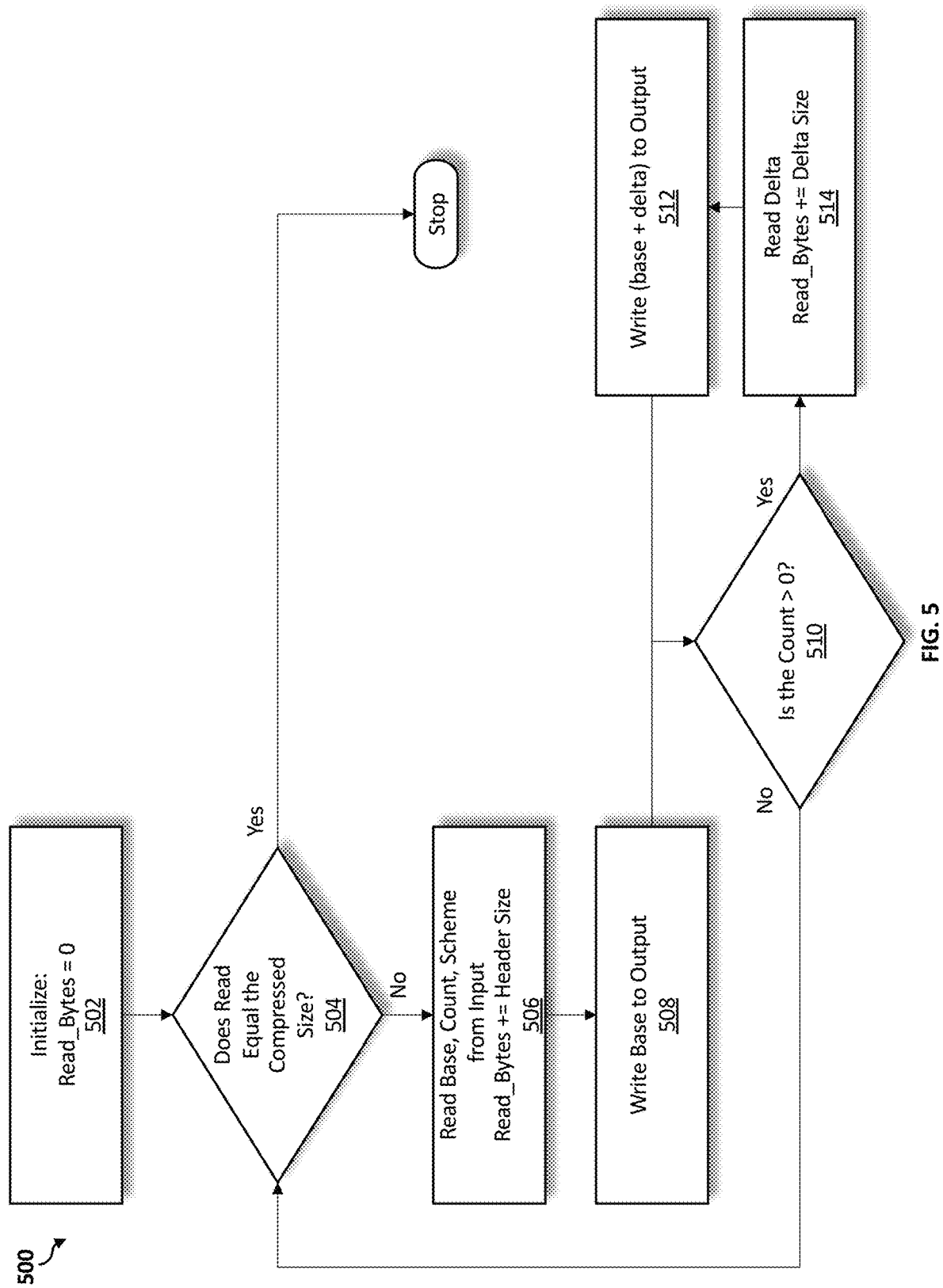
FIG. 5 is an operational flowchart illustrating a process for RLBD decompression according to at least one embodiment.

Referring now to FIG. 5, an operational flowchart illustrating the exemplary RLBD decompression process 500 used by the high-speed compression program 110a, 110b according to at least one embodiment is depicted.

At 502, the number of bytes read is initialized to zero, indicating that no bytes have yet been read from the compressed input stream.

Next, at 504, the high-speed compression program 110a, 110b determines if the number of bytes read equals the compressed size. The number of bytes read is compared to the known length of the compressed data.

If the high-speed compression program 110a, 110b determined that the number of bytes read does equal the compressed size at 504, then the program stops.

If the high-speed compression program 110a, 110b determined that the number of bytes read does not equal the compressed size at 504, then the base, count and scheme is read from the input at 506. A base, scheme and delta count (i.e., collectively the header) is read and consumed from the compressed input stream. The number of bytes read is incremented by the size of the header.

At 508, the base and output is written. The base read at 506 is appended to the output stream.

Next, at 510, the high-speed compression program 110a, 110b determines if the count is greater than zero. The delta count is compared to zero.

If the high-speed compression program 110a, 110b determined that the count is not greater than zero, then the high-speed compression program 110a, 110b determines if the number of bytes read equals the compressed size at 504. If the count is equal to zero, then the entire header and deltas have been processed and the high-speed compression program 110a, 110b returns to 504.

If the high-speed compression program 110a, 110b determined that the count is greater than zero, then the delta is read at 514. The next delta, where the delta size is determined by the scheme selected at 506 is read from the compressed input stream. The number of bytes read is incremented by the size of the delta.

Next, at 512, the high-speed compression program 110a, 110b writes the base plus delta to the output. The write value (i.e., base+delta) is written to the uncompressed output stream, where the delta was computed at 514 and the base was computed at 506.

Figure 6:
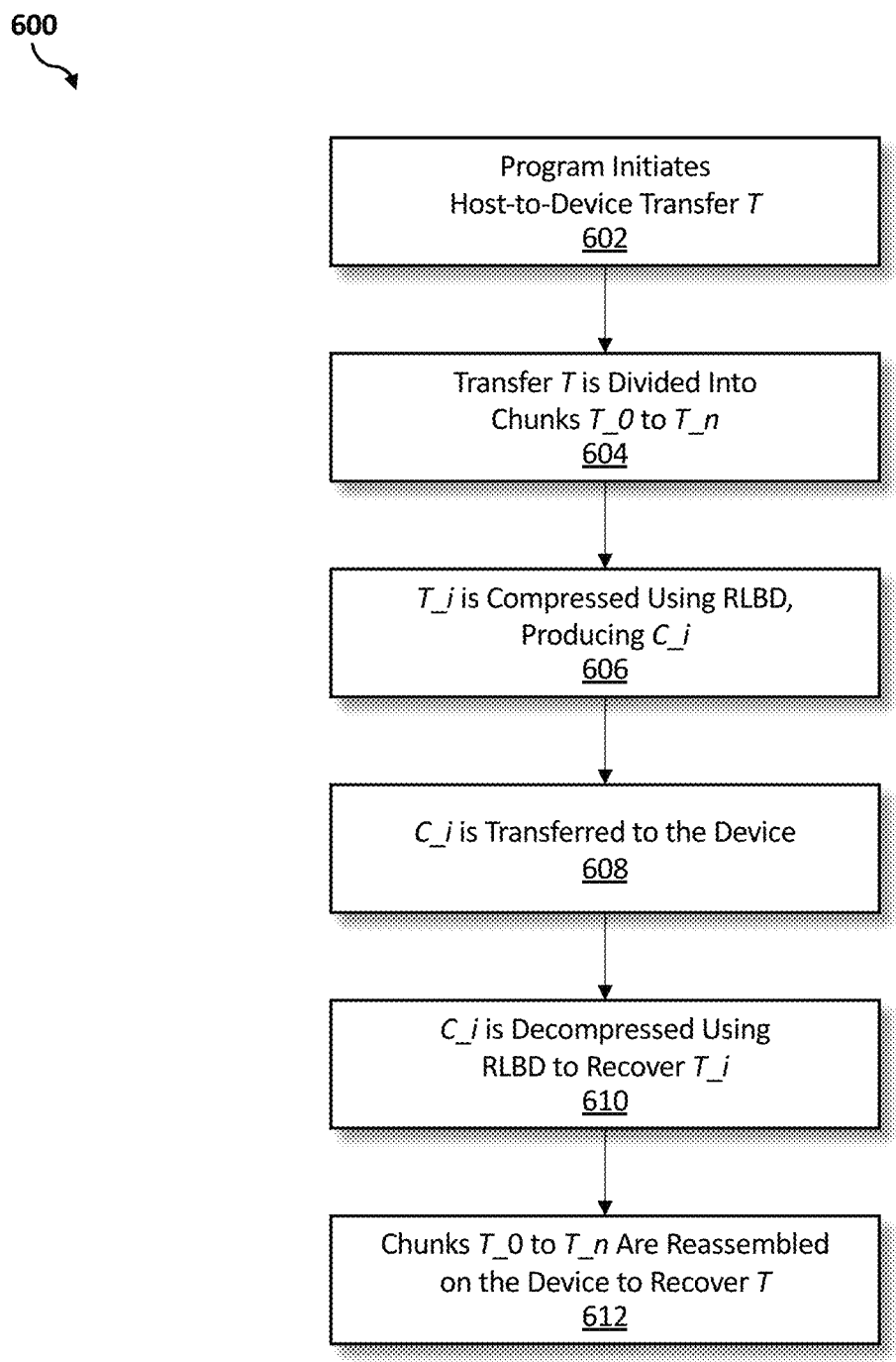
FIG. 6 is an operational flowchart illustrating a process for the CTDP pipeline according to at least one embodiment.

Referring now to FIG. 6, an operational flowchart illustrating the exemplary CTDP pipeline process 600 used by the high-speed compression program 110a, 110b according to at least one embodiment is depicted.

At 602, the high-speed compression program 110a, 110b initiates a host-to-device transfer T The initiation transfers T from the source to the target. A target may include a GPU or other attached computing devices with separate memory.

Next, at 604, the transfer T is divided into chunks T_0 to T_n. Transfer T is divided into chunks T_0 to T_n by the source. In at least one embodiment, the chunks are 128 KB in size and the number of chunks n is the size of T in bytes divided by 128 KB.

Then, at 606, T_i is compressed using RLBD, producing C_i. T_i is compressed by the source.

At 608, C_i is transferred to the target.

Then, at 610, C_i is decompressed using RLBD to recover T_i. It may be appreciated that step 606, step 608 and step 610 may all be executed for each chunk T_i from T_0 to T_n. It may be further appreciated that step 606, step 608 and step 610 may be run concurrently for successive i in 0 to n. For example, step 606 can compress T_i while step 608 transfers T_i−1 and step 610 decompresses T_i−2. The order of operations is shown in at least one embodiment of FIG. 3.

Next, at 612, chunks T_0 to T_n are reassembled on the device to recover T. Reassembly may be done by copying chunk T_i immediately after the end of T_i−1 immediately upon the completion of decompression at 610.

It may be appreciated that FIGS. 2-6 provide only an illustration of one embodiment and do not imply any limitations with regard to how different embodiments may be implemented. Many modifications to the depicted embodiment(s) may be made based on design and implementation requirements.

Figure 7:
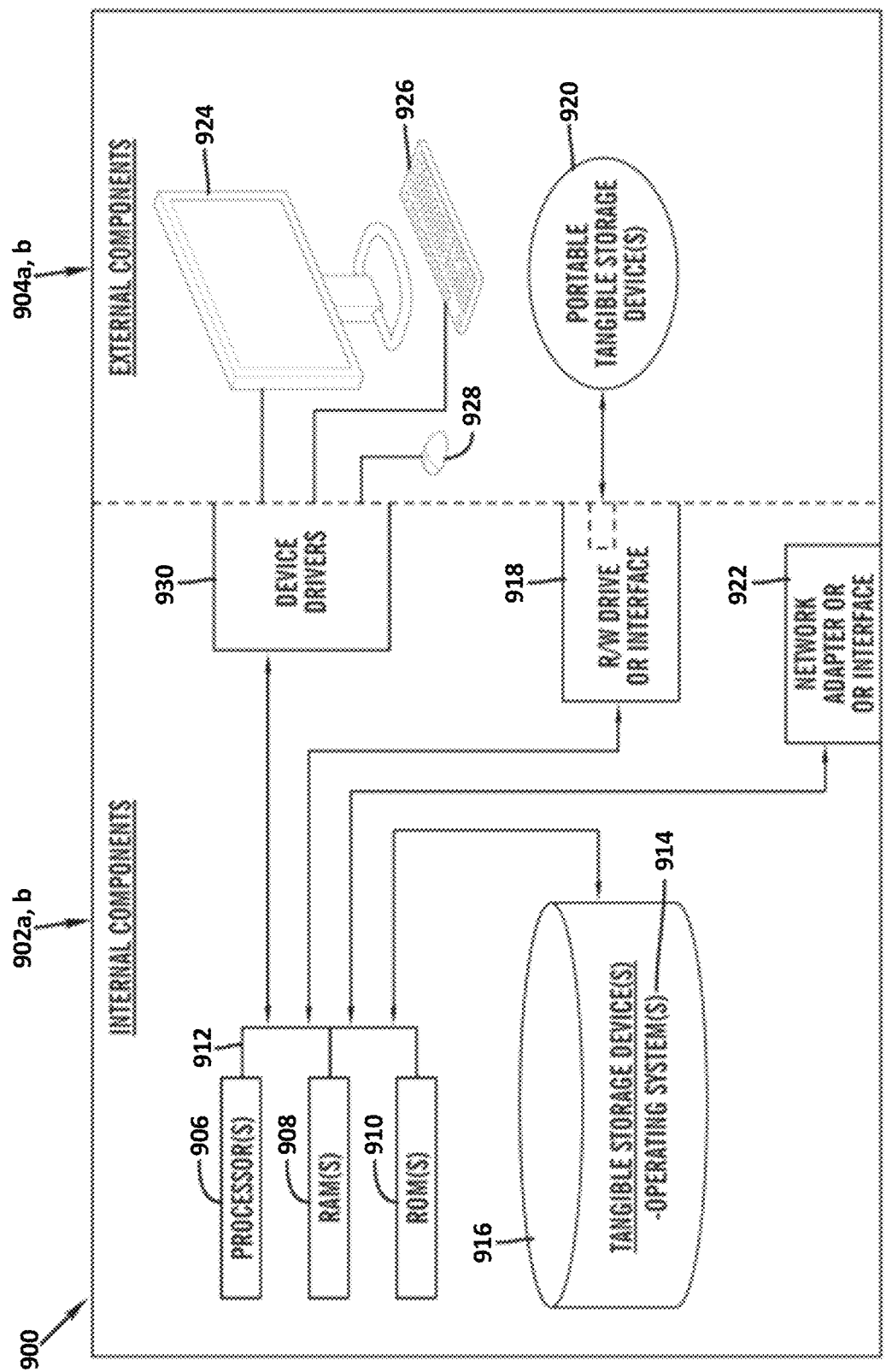
FIG. 7 is a block diagram of internal and external components of computers and servers depicted in FIG. 1 according to at least one embodiment.

FIG. 7 is a block diagram 900 of internal and external components of computers depicted in FIG. 1 in accordance with an illustrative embodiment of the present invention. It should be appreciated that FIG. 7 provides only an illustration of one implementation and does not imply any limitations with regard to the environments in which different embodiments may be implemented. Many modifications to the depicted environments may be made based on design and implementation requirements.

Data processing system 902, 904 is representative of any electronic device capable of executing machine-readable program instructions. Data processing system 902, 904 may be representative of a smart phone, a computer system, PDA, or other electronic devices. Examples of computing systems, environments, and/or configurations that may be represented by data processing system 902, 904 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

User client computer 102 and network server 112 may include respective sets of internal components 902 a, b and external components 904 a, b illustrated in FIG. 7. Each of the sets of internal components 902 a, b includes one or more processors 906, one or more computer-readable RAMs 908 and one or more computer-readable ROMs 910 on one or more buses 912, and one or more operating systems 914 and one or more computer-readable tangible storage devices 916. The one or more operating systems 914, the software program 108 and the high-speed compression program 110a in client computer 102, and the high-speed compression program 110b in network server 112, may be stored on one or more computer-readable tangible storage devices 916 for execution by one or more processors 906 via one or more RAMs 908 (which typically include cache memory). In the embodiment illustrated in FIG. 7, each of the computer-readable tangible storage devices 916 is a magnetic disk storage device of an internal hard drive. Alternatively, each of the computer-readable tangible storage devices 916 is a semiconductor storage device such as ROM 910, EPROM, flash memory or any other computer-readable tangible storage device that can store a computer program and digital information.

Each set of internal components 902 a, b also includes a R/W drive or interface 918 to read from and write to one or more portable computer-readable tangible storage devices 920 such as a CD-ROM, DVD, memory stick, magnetic tape, magnetic disk, optical disk or semiconductor storage device. A software program, such as the software program 108 and the high-speed compression program 110a, 110b can be stored on one or more of the respective portable computer-readable tangible storage devices 920, read via the respective R/W drive or interface 918 and loaded into the respective hard drive 916.

Each set of internal components 902 a, b may also include network adapters (or switch port cards) or interfaces 922 such as a TCP/IP adapter cards, wireless wi-fi interface cards, or 3G or 4G wireless interface cards or other wired or wireless communication links. The software program 108 and the high-speed compression program 110a in client computer 102 and the high-speed compression program 110b in network server computer 112 can be downloaded from an external computer (e.g., server) via a network (for example, the Internet, a local area network or other, wide area network) and respective network adapters or interfaces 922. From the network adapters (or switch port adaptors) or interfaces 922, the software program 108 and the high-speed compression program 110a in client computer 102 and the high-speed compression program 110b in network server computer 112 are loaded into the respective hard drive 916. The network may comprise copper wires, optical fibers, wireless transmission, routers, firewalls, switches, gateway computers and/or edge servers.

Each of the sets of external components 904 a, b can include a computer display monitor 924, a keyboard 926, and a computer mouse 928. External components 904 a, b can also include touch screens, virtual keyboards, touch pads, pointing devices, and other human interface devices. Each of the sets of internal components 902 a, b also includes device drivers 930 to interface to computer display monitor 924, keyboard 926 and computer mouse 928. The device drivers 930, R/W drive or interface 918 and network adapter or interface 922 comprise hardware and software (stored in storage device 916 and/or ROM 910).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 8:
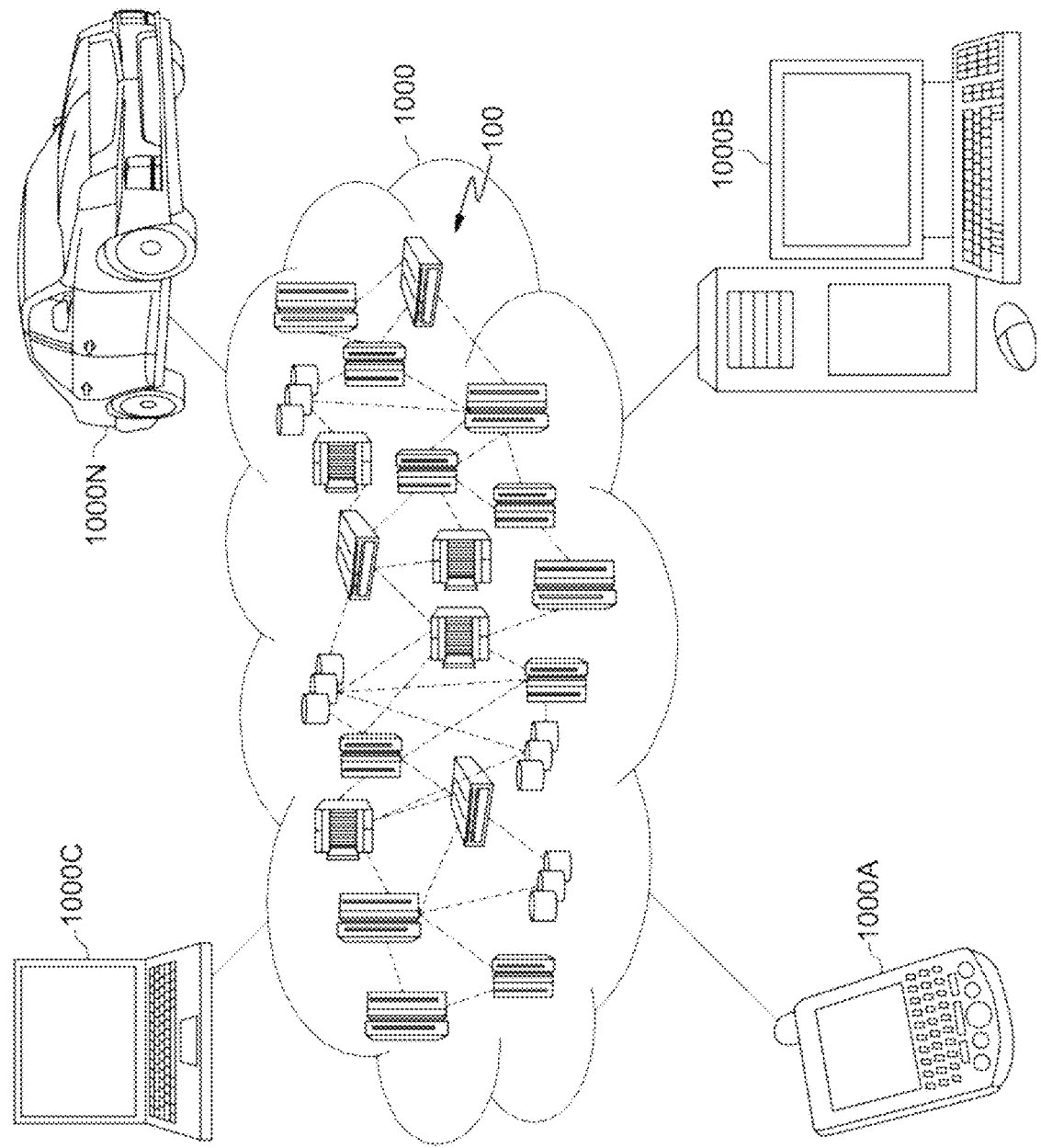
FIG. 8 is a block diagram of an illustrative cloud computing environment including the computer system depicted in FIG. 1, in accordance with an embodiment of the present disclosure.

Referring now to FIG. 8, illustrative cloud computing environment 1000 is depicted. As shown, cloud computing environment 1000 comprises one or more cloud computing nodes 100 with which local computing devices used by cloud consumers, such as, for example, personal digital assistant (PDA) or cellular telephone 1000A, desktop computer 1000B, laptop computer 1000C, and/or automobile computer system 1000N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 1000 to offer infrastructure, platforms and/or software as services for which a cloud consumer does not need to maintain resources on a local computing device. It is understood that the types of computing devices 1000A-N shown in FIG. 8 are intended to be illustrative only and that computing nodes 100 and cloud computing environment 1000 can communicate with any type of computerized device over any type of network and/or network addressable connection (e.g., using a web browser).

Figure 9:
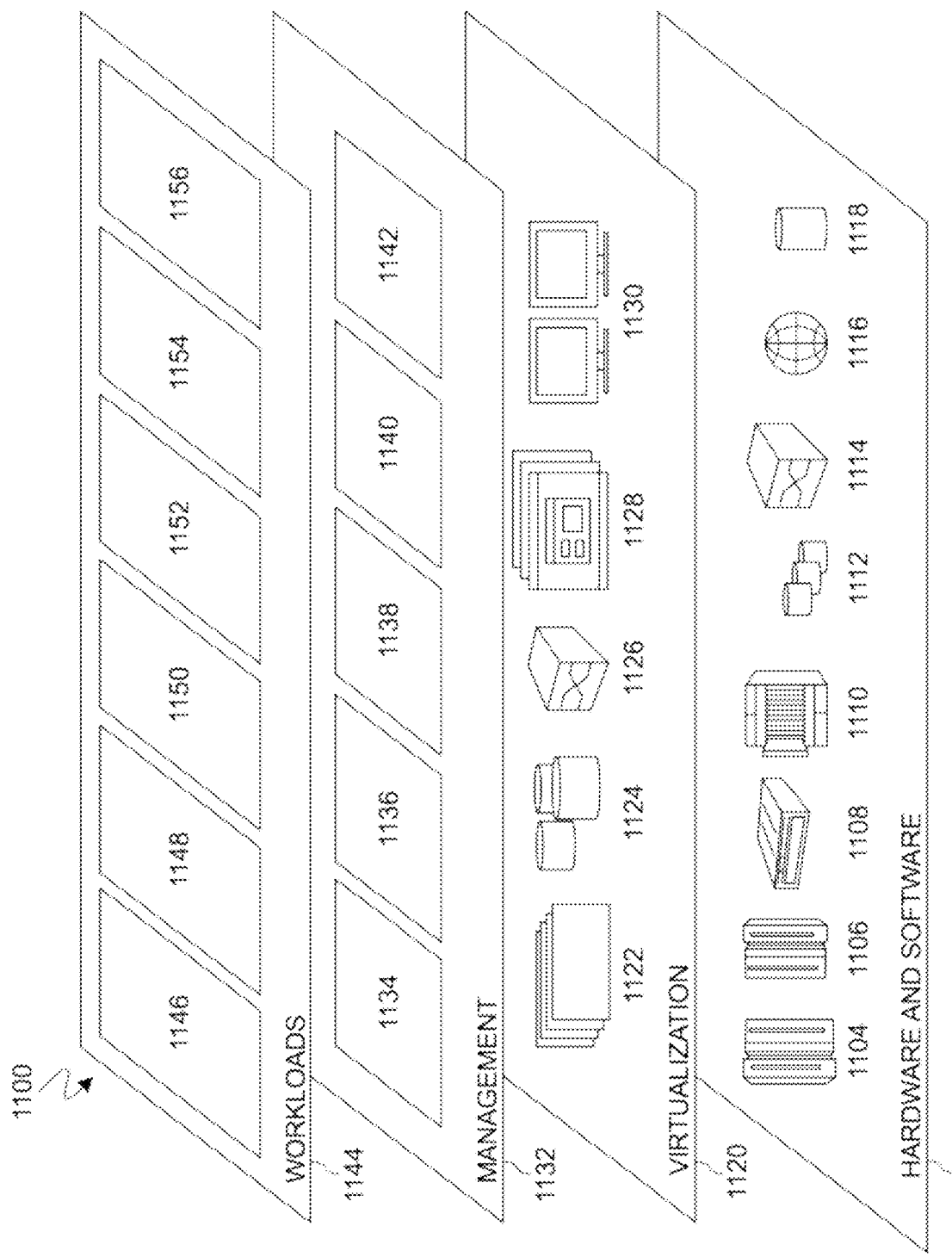
FIG. 9 is a block diagram of functional layers of the illustrative cloud computing environment of FIG. 8, in accordance with an embodiment of the present disclosure.

Referring now to FIG. 9, a set of functional abstraction layers 1100 provided by cloud computing environment 1000 is shown. It should be understood in advance that the components, layers, and functions shown in FIG. 9 are intended to be illustrative only and embodiments of the invention are not limited thereto. As depicted, the following layers and corresponding functions are provided:

Hardware and software layer 1102 includes hardware and software components. Examples of hardware components include: mainframes 1104; RISC (Reduced Instruction Set Computer) architecture based servers 1106; servers 1108; blade servers 1110; storage devices 1112; and networks and networking components 1114. In some embodiments, software components include network application server software 1116 and database software 1118.

Virtualization layer 1120 provides an abstraction layer from which the following examples of virtual entities may be provided: virtual servers 1122; virtual storage 1124; virtual networks 1126, including virtual private networks; virtual applications and operating systems 1128; and virtual clients 1130.

In one example, management layer 1132 may provide the functions described below. Resource provisioning 1134 provides dynamic procurement of computing resources and other resources that are utilized to perform tasks within the cloud computing environment. Metering and Pricing 1136 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 1138 provides access to the cloud computing environment for consumers and system administrators. Service level management 1140 provides cloud computing resource allocation and management such that required service levels are met. Service Level Agreement (SLA) planning and fulfillment 1142 provide pre-arrangement for, and procurement of, cloud computing resources for which a future requirement is anticipated in accordance with an SLA.

Workloads layer 1144 provides examples of functionality for which the cloud computing environment may be utilized. Examples of workloads and functions which may be provided from this layer include: mapping and navigation 1146; software development and lifecycle management 1148; virtual classroom education delivery 1150; data analytics processing 1152; transaction processing 1154; and high-speed data compression 1156. A high-speed compression program 110a, 110b provides a way to compress data to be transferred between a computer and an accelerator device without the need to operate with fixed-length data segments.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for high-speed data compression, the method comprising:
    selecting a header based on an input stream, wherein the header includes a base, a scheme and a delta count, wherein a current value is used as a base;
    determining whether there are any remaining values in an uncompressed input stream based on the selected header;
    reading a first next value from the input stream;
    determining whether the read first next value is representable with a current base scheme by verifying a resulting difference between the current value and the first next value can be represented by a number of bytes specified by the scheme;
    calculating the delta count based on determining that the read first next value is representable with the current base scheme; and
    writing the calculated delta count to the selected header.

2. The method of claim 1, further comprising:
    reading a second next value from an incremented delta count;
    determining that the read second next value is not representable with the current base scheme;
    writing the base, the scheme and a second next delta count based on the read second next value;
    determining whether there are any remaining next values in the uncompressed input stream based on the written base, the written scheme and the written second next delta count; and
    decompressing the current base scheme based on determining that there are no remaining next values in the uncompressed input stream.

3. The method of claim 2, wherein decompressing the current base scheme further comprises:
    initializing a number of bytes read to zero;
    determining that the number of bytes read does not equal a compressed size;

reading the header based on the number of bytes read;
writing the base to a second output stream based on the read header;
determining whether the delta count is greater than zero based on the written base;
reading the delta size from a compressed input stream based on determining that the delta count is greater than zero; and
writing a base plus delta to an output based on the read delta size.

4. The method of claim 2, wherein decompressing the current base scheme further comprises:
initializing a number of bytes read to zero;
determining that the number of bytes read does not equal a compressed size;
reading the header based on the number of bytes read;
writing the base to a second output stream based on the read header; and
determining whether the delta count is zero based on the written base.

5. The method of claim 2, wherein decompressing the current base scheme further comprises:
initializing a number of bytes read to zero; and
determining whether the number of bytes read equals a compressed size.

6. The method of claim 1, wherein a compress-transfer-decompress pipeline (CTDP) process is used to break a large data set transmitted between a computer memory and an accelerator device memory into a plurality of smaller data chunks.

7. The method of claim 6, wherein the CTDP process further comprises;
dividing the data set into the plurality of smaller data chunks;
compressing the data chunks using a run-length base-delta compression algorithm;
transferring the compressed data chunks to a target;
decompressing the transferred data chunks using the run-length base-delta compression algorithm; and
reassembling the decompressed data chunks on a device to recover the data set.

8. The method of claim 7, wherein the target includes a graphics processing unit (GPU) or a computing device with a separate memory.

9. A computer system for high-speed data compression, comprising:
one or more processors, one or more computer-readable memories, one or more non-transitory computer-readable tangible storage media, and program instructions stored on at least one of the one or more tangible storage media for execution by at least one of the one or more processors via at least one of the one or more memories, wherein the computer system is capable of performing a method comprising:
selecting a header based on an input stream, wherein the header includes a base, a scheme and a delta count, wherein a current value is used as a base;
determining whether there are any remaining values in an uncompressed input stream based on the selected header;
reading a first next value from the input stream;
determining whether the read first next value is representable with a current base scheme by verifying a resulting difference between the current value and the first next value can be represented by a number of bytes specified by the scheme;
calculating the delta count based on determining that the read first next value is representable with the current base scheme; and
writing the calculated delta count to the selected header.

10. The computer system of claim 9, further comprising:
reading a second next value from an incremented delta count;
determining that the read second next value is not representable with the current base scheme;
writing the base, the scheme and a second next delta count based on the read second next value;
determining whether there are any remaining next values in the uncompressed input stream based on the written base, the written scheme and the written second next delta count; and
decompressing the current base scheme based on determining that there are no remaining next values in the uncompressed input stream.

11. The computer system of claim 10, the base scheme decompression further comprising:
initializing a number of bytes read to zero;
determining that the number of bytes read does not equal a compressed size;
reading the header based on the number of bytes read;
writing the base to a second output stream based on the read header;
determining whether the delta count is greater than zero based on the written base;
reading the delta size from a compressed input stream based on determining that the delta count is greater than zero; and
writing a base plus delta to an output based on the read delta size.

12. The computer system of claim 10, the base scheme decompression further comprising:
initializing a number of bytes read to zero;
determining that the number of bytes read does not equal a compressed size;
reading the header based on the number of bytes read;
writing the base to a second output stream based on the read header; and
determining whether the delta count is zero based on the written base.

13. The computer system of claim 10, the base scheme decompression further comprising:
initializing a number of bytes read to zero; and
determining whether the initialized number of bytes read equals a compressed size.

14. The computer system of claim 9, wherein a compress-transfer-decompress pipeline (CTDP) process is used to break a large data set transmitted between a computer memory and an accelerator device memory into a plurality of smaller data chunks.

15. The computer system of claim 14, the CTDP process further comprising;
dividing the data set into the plurality of smaller data chunks;
compressing the data chunks using a run-length base-delta compression algorithm;
transferring the compressed data chunks to a target;
decompressing the transferred data chunks using the run-length base-delta compression algorithm; and
reassembling the decompressed data chunks on a device to recover the data set.

16. The computer system of claim 15, wherein the target includes a graphics processing unit (GPU) or a computing device with a separate memory.

17. A computer program product for high-speed data compression, comprising:
- one or more non-transitory computer-readable storage media and program instructions stored on at least one of the one or more tangible storage media, the program instructions executable by a processor to cause the processor to perform a method comprising:
- selecting a header based on an input stream, wherein the header includes a base, a scheme and a delta count, wherein a current value is used as a base;
- determining whether there are any remaining values in an uncompressed input stream based on the selected header;
- reading a first next value from the input stream;
- determining whether the read first next value is representable with a current base scheme by verifying a resulting difference between the current value and the first next value can be represented by a number of bytes specified by the scheme;
- calculating the delta count based on determining that the read first next value is representable with the current base scheme; and
- writing the calculated delta count to the selected header.

18. The computer program product of claim 17, further comprising:
- reading a second next value from an incremented delta count;
- determining that the read second next value is not representable with the current base scheme;
- writing the base, the scheme and a second next delta count based on the read second next value;
- determining whether there are any remaining next values in the uncompressed input stream based on the written base, the written scheme and the written second next delta count; and
- decompressing the current base scheme based on determining that there are no remaining next values in the uncompressed input stream.

19. The computer program product of claim 18, the base scheme decompression further comprising:
- initializing a number of bytes read to zero;
- determining that the number of bytes read does not equal a compressed size;
- reading the header based on the number of bytes read;
- writing the base to a second output stream based on the read header;
- determining whether the delta count is greater than zero based on the written base;
- reading the delta size from a compressed input stream based on determining that the delta count is greater than zero; and
- writing a base plus delta to an output based on the read delta size.

20. The computer program product of claim 18, the base scheme decompression further comprising:
- initializing a number of bytes read to zero;
- determining that the number of bytes read does not equal a compressed size;
- reading the header based on the number of bytes read;
- writing the base to a second output stream based on the read header; and
- determining whether the delta count is zero based on the written base.

* * * * *